United States Patent [19]
Imai

[11] Patent Number: 5,294,506
[45] Date of Patent: Mar. 15, 1994

[54] PHOTOMASK

[75] Inventor: Tadayoshi Imai, Itami, Japan

[73] Assignee: Mitsubishi Denki Kabushiki Kaisha, Tokyo, Japan

[21] Appl. No.: 941,809

[22] Filed: Sep. 8, 1992

[51] Int. Cl.$^5$ .................................................. G03F 9/00
[52] U.S. Cl. ........................................ 430/5; 430/322; 430/396
[58] Field of Search .................... 430/5, 322, 396

[56] References Cited

U.S. PATENT DOCUMENTS

| | | | |
|---|---|---|---|
| 4,169,655 | 10/1979 | Jacobsson | 428/428 |
| 4,971,843 | 11/1990 | Michelotti et al. | 428/428 |
| 5,045,417 | 9/1991 | Okamoto | 430/5 |

FOREIGN PATENT DOCUMENTS 62-50811 10/1987 Japan .

Primary Examiner—Marion E. McCamish
Assistant Examiner—Mark A. Chapman
Attorney, Agent, or Firm—Oblon, Spivak, McClelland, Maier & Neustadt

[57] ABSTRACT

In a photomask according to the present invention, an attenuating film is formed on one major surface of a transparent glass substrate. The attenuating film has an opening, in which a phase-shifting film is formed. A non-transparent film for shutting out incident light is formed a portion of the attenuating film while being contiguous with the phase-shifting film. Thus, the intensity of light through the attenuating film substantially coincides with the intensity of the phase-shifting film. As a result, the peak intensity passing through the photomask becomes constant.

8 Claims, 5 Drawing Sheets

PHOTOMASK

BACKGROUND OF THE INVENTION

1. Field of the Invention

The present invention relates to a photomask, and more specifically, to a photomask used when a pattern is transferred to a semiconductor substrate.

2. Description of the Background Art

As semiconductor integrated circuits are miniaturized, a phase shift technology as one of methods of improving resolution of a fine pattern has been developed, which is a method of inverting by 180° a phase of light transmitted through light transmitting regions formed adjacent to each other on a photomask for weakening an interference with light to each other to enhance the resolution.

FIG. 10 is a sectional view of a photomask which is used in transferring a pattern to a semiconductor substrate, utilizing the phase shift technology. In FIG. 10, the photomask includes a transparent glass substrate 1 of composite quartz of 0.09 inch thickness and of 90% light transmittance, an antireflection film 2 formed of molybdenum oxide silicide of 400 Å thickness on a first major surface of the glass substrate 1, a non-transparent film 3 formed of molybdenum silicide of 1000 Å thickness on the antireflection film 2, an antireflection film 4 formed of molybdenum oxide silicide of 400 Å thickness on the non-transparent film 3, a phase-shifting film 5 formed of silicon oxide of 4000 Å thickness and of 90% light transmittance on the first major surface of the glass substrate 1.

The non-transparent film 3 shuts out light, and the antireflection films 2, 4 prevent light from being reflected to top and bottom surfaces of the non-transparent film 3. The non-transparent film 3 and the antireflection films 2, 4 are formed on the same pattern, and based upon the pattern, resist on the semiconductor substrate is irradiated with light. The shifter film 5 delays the light so that it arrives 180° out of phase with the incident light.

FIG. 11 is a schematic diagram showing a phase shift technology in which the photomask of FIG. 10 is used. First, the glass substrate has its second major surface irradiated with g-lines of 436 nm wavelength. The g-lines are transmitted through all the regions except for the non-transparent film 3, that is, through the glass substrate 1 alone, or both the glass substrate 1 and the shifter film 5. The g-lines transmitted through the glass substrate 1 and the shifter film 5 is 180° out of phase with the g-lines transmitted through the glass substrate 1 alone. Thus, when a positive-type photoresist coating the semiconductor substrate is irradiated with the g-lines transmitted through the photomask, the amplitude of the g-lines on the wafer periodically varies in positive and negative directions. Then, when the surface of the positive-type photoresist which has been irradiated with the g-lines is removed by development, the intended pattern can be obtained.

In the schematic diagram of FIG. 11 showing the phase shift technology, the g-lines transmitted through the glass substrate 1 alone are decayed in intensity to 90% of the intensity of the g-lines directed to the first major surface of the glass substrate 1. Also, the g-lines transmitted through the glass substrate 1 and the shifter film 5 are decayed to 80% of the intensity of the g-lines directed to the first major surface of the glass substrate 1 (First, the glass substrate 1 attenuates the g-lines to 90% of its initial, and the shifter film 5 further attenuates to 90%. Thus, the sum of the attenuation is 90%×90%≈80%). Hence, when the positive type photoresist coating the semiconductor substrate is irradiated with the g-lines transmitted through the photomask, the peak intensity on the photoresist is alternately to be 80% or 90% of the incident g-lines on the predetermined cycle. Thus, in the region irradiated with the g-lines having the 90% peak intensity, a developing rate is higher than that in the region irradiated with the g-lines having the 80% peak intensity, and consequently, adjacent grooves A and B defined by the pattern become different in width. Thus, there arises the problem that an accurate pattern cannot be obtained.

SUMMARY OF THE INVENTION

According to the present invention, a photomask comprises: a transparent glass substrate having one major surface: an attenuating film formed on the major surface of the transparent glass substrate for decaying incident light, the attenuating film having an opening; a phase-shifting film formed on a portion of the major surface, the portion corresponding to the opening of the attenuating film; and a non-transparent film for shutting out incident light, the non-transparent film being formed on a portion of the attenuating film while being contiguous with the phase-shifting film.

In an aspect of the present invention, the photomask comprises: a transparent glass substrate having one major surface; an attenuating film formed on the major surface of the transparent glass substrate for decaying incident light; a phase-shifting film formed on the major surface, the phase-shifting film being apart from the attenuating film; and a non-transparent film formed on the major surface of the transparent glass substrate, the non-transparent film being between the phase-shifting film and the attenuating film.

The photomask may further comprise a first antireflection film provided between the attenuating film and the non-transparent film.

The photomask may further comprises a second antireflection film provided on the non-transparent film.

Preferably, the light transmittance of the phase-shifting film coincides the light transmittance of the attenuating film.

Accordingly, it is an object of the present invention to provide a photomask by which an accurate pattern can be made.

These and other objects, features, aspects and advantages of the present invention will become more apparent from the following detailed description of the present invention when taken in conjunction with the accompanying drawings.

DETAILED DESCRIPTION OF THE PREFERRED EMBODIMENT

A. First Embodiment

Figure 1:
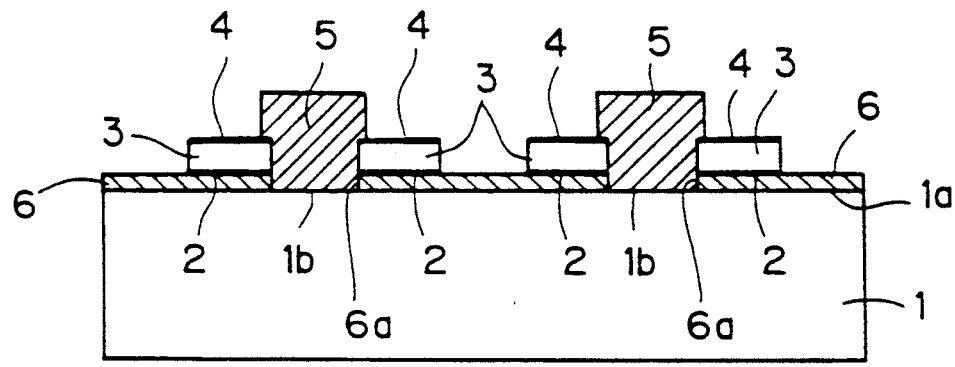
FIG. 1 is a sectional view of a first embodiment according to the present invention.

FIG. 1 is a sectional view of a first embodiment according to the present invention. The photomask of the first embodiment comprises a transparent glass substrate 1 made of quartz of 0.09 inch thickness, the glass substrate 1 having 90% light transmittance. An attenuating film 6 is formed on one major surface 1a of the glass substrate 1 so as to have openings 6a. An antireflection film 2 of molybdenum oxide silicide of 400 Å thickness is provided on the attenuating film 6 while being located at side edge portions adjacent to the openings 6a. A non-transparent film 3 and an antireflection film 4 are stacked up the antireflection film 3 in this order. The non-transparent film 3 is made of molybdenum silicide of 1000 Å thickness, whereas the antireflection film 4 of molybdenum oxide silicide of 400 Å thickness. A phase-shifting film 5, constituted of silicon oxide of 4000 Å thickness and having 90% light transmittance, is provided on portions 1b of the major surface 1a corresponding to the openings 6a.

A process of manufacturing a photomask configured as mentioned above will now be described with reference to FIGS. 2 and 7.

Figure 2:
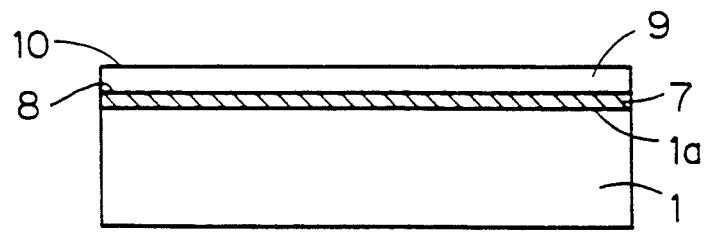
FIGS. 2 to 7 are sectional views showing manufacturing steps of the first embodiment according to the present invention.

First, as shown in FIG. 2, over the major surface 1a of the transparent glass substrate 1 formed of composite quartz having a thickness of 0.09 inch, chromium oxide 7 of 100 Å thickness, molybdenum oxide silicide 8 of 400 Å thickness, molybdenum silicide 9 of 1000 Å thickness, and molybdenum oxide silicide 10 of 400 Å thickness are deposited in this order.

Figure 3:
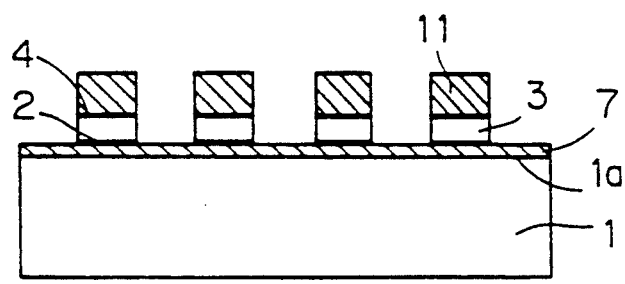

Next, as shown in FIG. 3, the whole surface of the molybdenum oxide silicide 10 is coated with negative-type photoresist 11. Thereafter, the negative-type photoresist 11 is exposed and developed so as to remain in a plurality of regions including the openings 6a (FIG. 1). Then, with the remained photoresist 11 as a mask, the molybdenum oxide silicide 10, the molybdenum silicide 9 and the molybdenum oxide silicide 8 are patterned by etching. As a result, the antireflection film 2, a non-transparent film 3, and the antireflection film 4 are formed.

Figure 4:
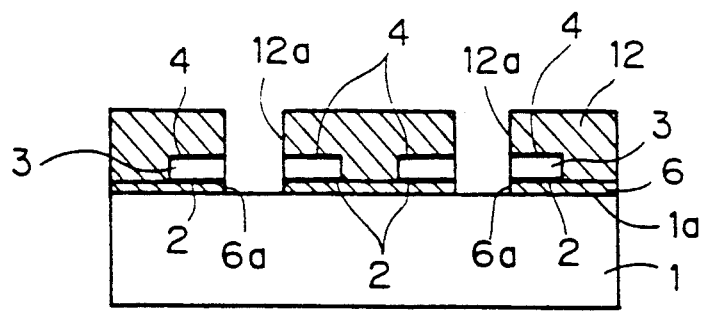

Then, as shown in FIG. 4, the remained photoresist 11 is etched away, and thereafter, the whole major surface 1a of the glass substrate 1 is coated with positive-type photoresist 12. Following this, the positive-type photoresist 12 is partially removed by exposure and development, so that the patterned photoresist 12 has openings 12a each of which coincides with the openings 6a. Then, with the patterned photoresist 12 as a mask, the chromium oxide 7 is etched to form the attenuating film 6 on the major surface 1a of the glass substrate 1 while the openings 6a formed in the attenuating film 6.

Figure 5:
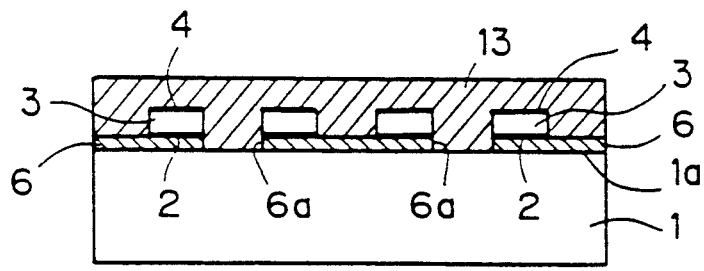

Further, as shown in FIG. 5, after the patterned photoresist 12 is etched away, silicon oxide 13 is deposited in 4000 Å thickness over the whole major surface 1a of the glass substrate 1 by CVD.

Figure 6:
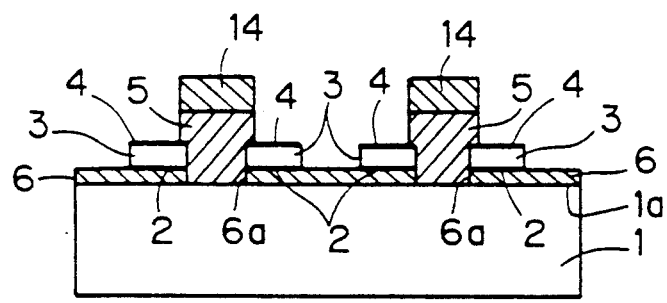

Then, as shown in FIG. 6, the whole surface of the silicon oxide 13 is coated with negative-type photoresist 14. The photoresist 14 is then exposed and developed so that the negative-type photoresist 14 remains in the region where the shifter film 5 is to be formed. Following this, with the remained photoresist 14 as a mask, the silicon oxide 13 is etched to form the shifter film 5. Thus, the phase-shifting film 5 is formed on the major surface 1a while corresponding to the openings 6a.

Figure 7:
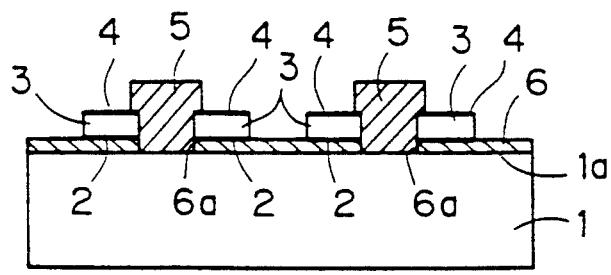

Moreover, as shown in FIG. 7, the negative-type photoresist 14 is removed by etching, and thus, the intended photomask is completed.

Figure 8:
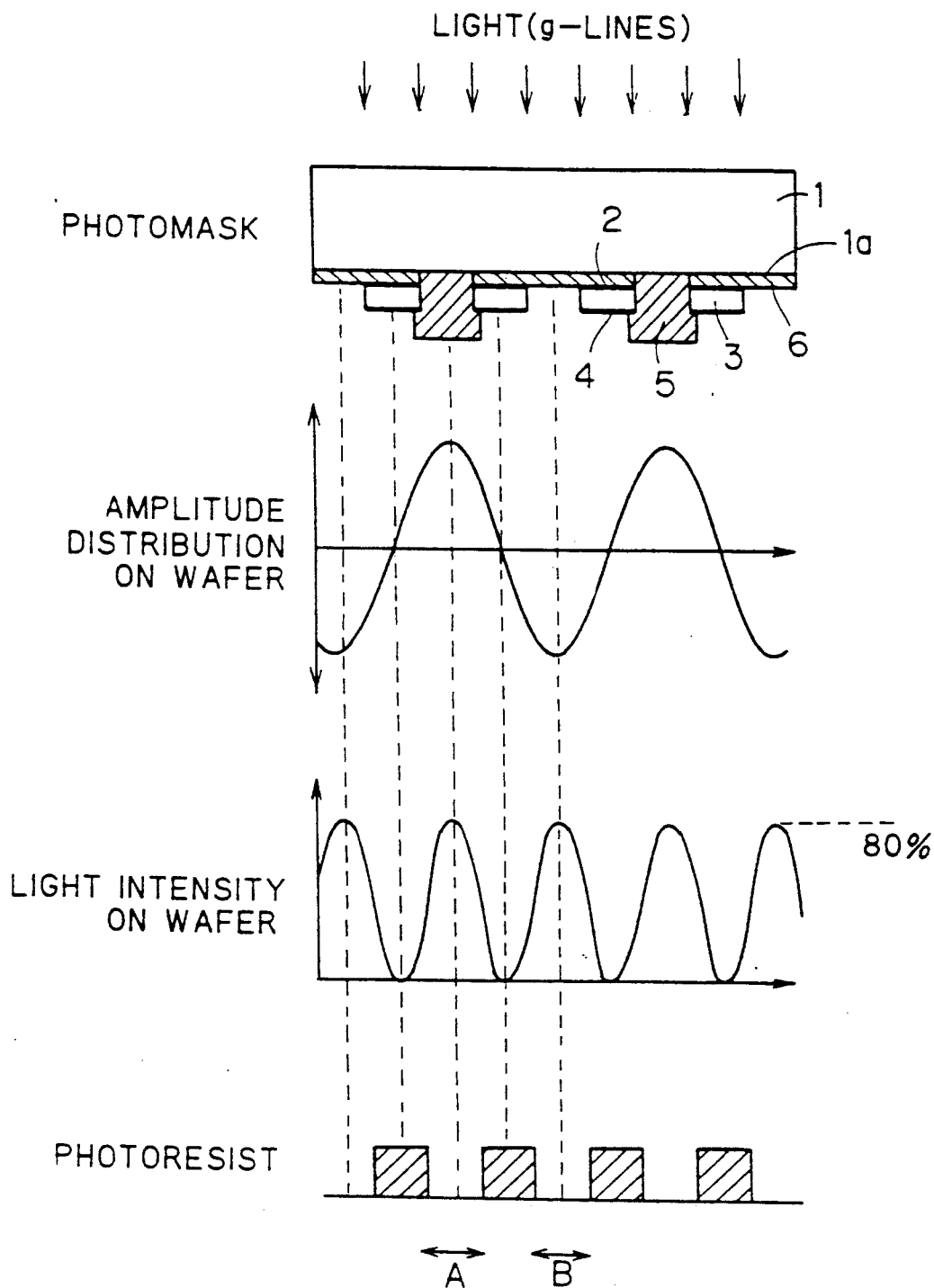
FIG. 8 is a schematic diagram showing a phase shift technology to which the first embodiment according to the present invention is applied.
Figure 11:
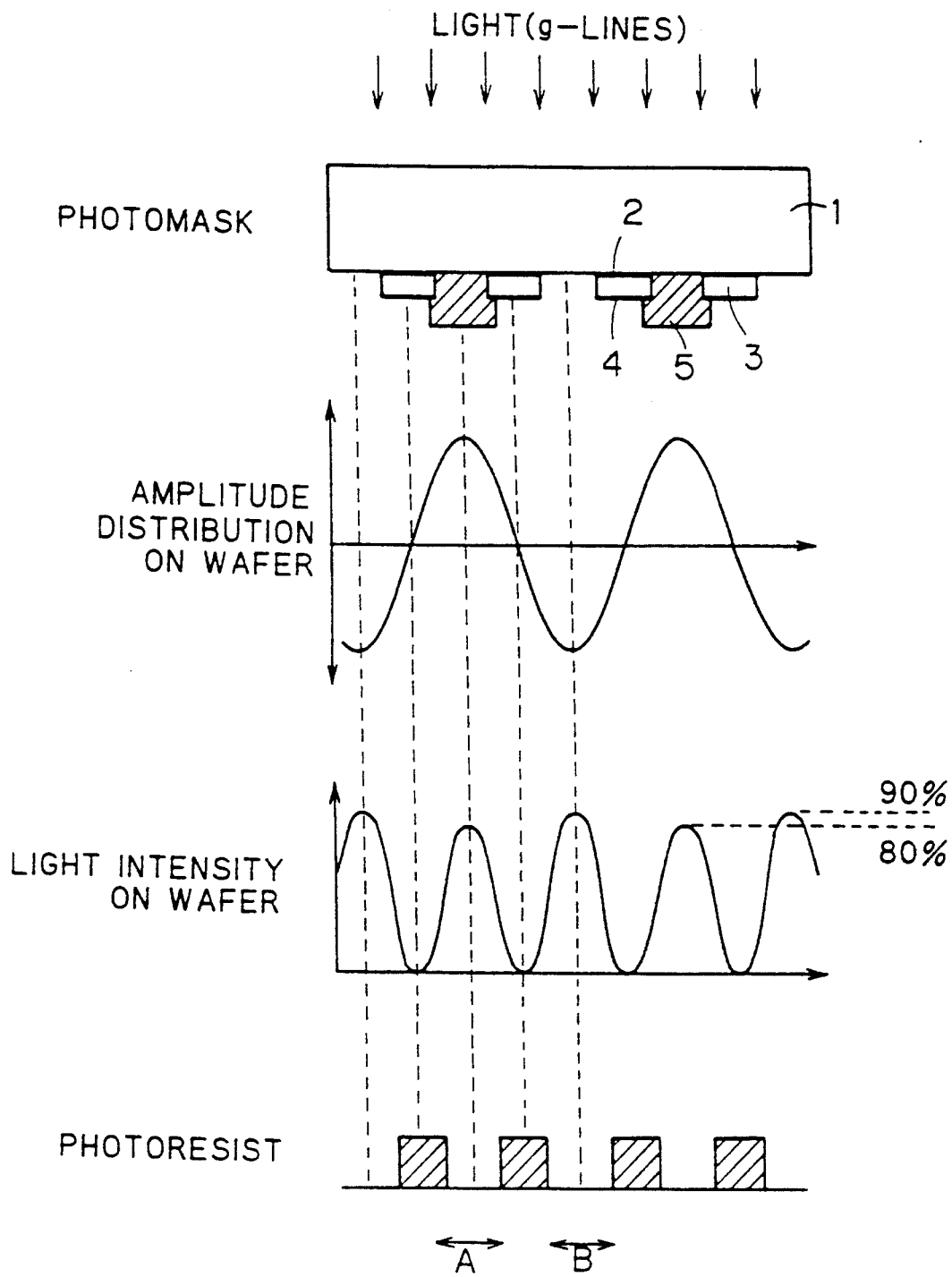
FIG. 11 is a schematic diagram showing a phase shift technology to which a conventional photomask is applied.

FIG. 8 is a schematic diagram showing a phase shift technology where a photomask configured as in the foregoing is used. The g-lines of 436 nm wavelength which is directed to the major surface 1a of the glass substrate 1 are transmitted through transparent regions except for the non-transparent film 3, that is, a region consisting of the glass substrate 1 and the shifter film 5 and a region consisting of the glass substrate 1 and the attenuating film 6. The g-lines transmitted through the glass substrate 1 and the shifter film 5 are, similar to the prior art technology shown in FIG. 11, decayed in intensity to 80% of the g-lines impinging upon the major surface 1a of the glass substrate 1. Also the g-lines transmitted through the glass substrate 1 and the attenuating film 6 are decayed in intensity to 80% of the g-lines impinging upon the major surface 1a of the glass substrate (First, the glass substrate 1 decays the incident g-lines to 90%, and the attenuating film 6 further decays to 90%. Thus, the sum of the attenuation is $90\% \times 90\% \approx 80\%$). When the surface of the positive-type photoresist coating the semiconductor substrate is irradiated with the g-lines transmitted through the photomask, the intensity of the g-lines on the photoresist has periodic peaks of 80%. Thus, the peak intensity of the g-lines transmitted through the photomask becomes constant, and a rate of developing the positive-type photoresist irradiated with the g-lines becomes uniform. Accordingly, adjacent grooves A and B defined by the resultant pattern keep their width equivalent to each other, and thus, the photomask by which an accurate pattern is made can be acquired.

B. Second Embodiment

Figure 9:
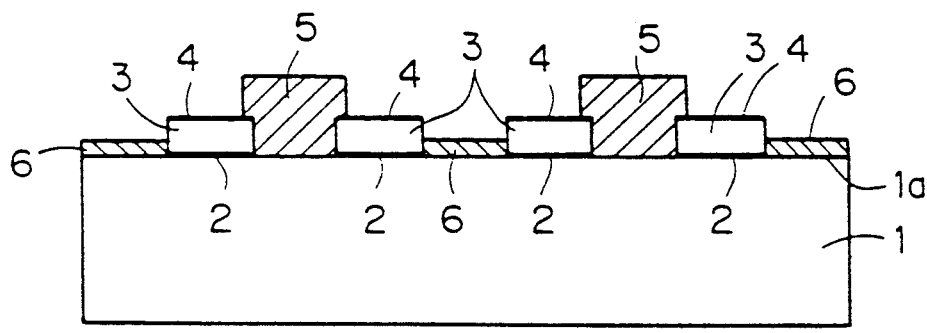
FIG. 9 is a sectional view of a second embodiment according to the present invention.
Figure 10:
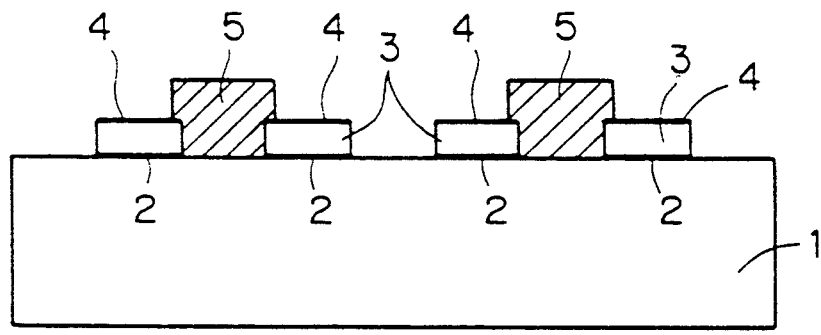
FIG. 10 is a sectional view of a conventional photomask.

FIG. 9 shows another embodiment according to the present invention which has one significant difference from the first embodiment previously described. The difference between the photomask of FIG. 9 and the first embodiment is that the antireflection film 2 is directly formed on the major surface 1a of the transparent glass substrate 1. In the photomask, thus, the attenuating film 6 decays the impinging g-line to 90% of the initial intensity while phase-shifting film 5 decays the same to 90% thereof. As a result, the peak intensity passing through the photomask of the second embodiment on the wafer becomes constant, similar to the first embodiment. This achieves the similar effect to the first embodiment.

While the invention has been shown and described in detail, the foregoing description is in all aspects illustrative and not restrictive. It is therefore understood that numerous modifications and variations can be devised without departing from the scope of the invention.

What is claimed is:

1. A photomask comprising:
   a transparent glass substrate having one major surface;
   an attenuating film formed on the major surface of said transparent glass substrate for decaying incident light, said attenuating film having an opening;

a phase-shifting film formed on a portion of the major surface, the portion corresponding to said opening of said attenuating film; and a non-transparent film for shutting out incident light, said non-transparent film being formed on a portion of said attenuating film while being contiguous with said phase-shifting film;

said attenuating film having an amount of attenuation such that light transmitted through said attenuating film has an intensity corresponding to light passing through said phase-shifting film.

2. A photomask of claim 1, further comprising a first antireflection film provided between said attenuating film and said non-transparent film.

3. A photomask of claim 2, further comprising a second antireflection film provided on said non-transparent film.

4. A photomask of claim 1, wherein the light transmittance of said phase-shifting film coincides the light transmittance of said attenuating film.

5. A photomask for transferring a predetermined pattern comprising:

a transparent glass substrate having one major surface;

an attenuating film formed on the major surface of said transparent glass substrate for decaying incident light;

a phase-shifting film formed on the major surface of said transparent glass substrate, said phase-shifting film located on said major surface such that a space is provided between said phase-shifting film and said attenuating film; and a non-transparent film formed on the major surface of said transparent glass substrate, said non-transparent film provided in said space such that said non-transparent film is between said attenuating film and said phase-shifting film;

said attenuating film having an amount of attenuation such that light transmitted through said attenuating film has an intensity corresponding to light passing through said phase-shifting film.

6. A photomask of claim 5, further comprising a first antireflection film provided between the major surface of said transparent glass substrate and said non-transparent film.

7. A photomask of claim 6, further comprising a second antireflection film provided on said non-transparent film.

8. A photomask of claim 5, wherein the light transmittance of said phase-shifting film coincides the light transmittance of said attenuating film.

* * * * *